(12) United States Patent  
Ott

(10) Patent No.: US 6,369,593 B1  
(45) Date of Patent: Apr. 9, 2002

(54) LOAD BOARD TEST FIXTURE

(75) Inventor: Rainer Ott, Müchen (DE)

(73) Assignee: Test Plus Electronic GmbH, Munich (DE)

( * ) Notice: Subject to any disclaimer, the term of this patent is extended or adjusted under 35 U.S.C. 154(b) by 0 days.

(21) Appl. No.: 09/416,084

(22) Filed: Oct. 12, 1999

(30) Foreign Application Priority Data

Oct. 13, 1998 (DE) .......................................... 198 47 735

(51) Int. Cl.$^7$ ............................................... G01R 31/02

(52) U.S. Cl. ..................... 324/754; 324/758; 324/761

(58) Field of Search ................................ 324/754, 758, 324/755, 762, 761, 765

(56) References Cited

U.S. PATENT DOCUMENTS

| | | | |
|---|---|---|---|
| 4,774,462 A | * | 9/1988 | Black .......................... 324/758 |
| 4,820,975 A | * | 4/1989 | Diggle ........................ 324/758 |
| 5,408,189 A | * | 4/1995 | Swart .......................... 324/758 |

* cited by examiner

*Primary Examiner*—Safet Metjahic  
*Assistant Examiner*—Anjan K Deb  
(74) *Attorney, Agent, or Firm*—Scully, Scott, Murphy & Presser

(57) ABSTRACT

Test adapter for testing a loaded circuit board (6), comprising a probe plate (1), on which test probes (3) for the contact of plungers of the test probes (3a) with test points (7) of the circuit board (6) are fixed, and a moving plate (4), with which the circuit board (6) can be coupled by means of locating pins (5), that is arranged between the circuit board (6) and the probe plate (1) and having through bores (8) for the test probes (3). The test adapter further comprises an adjusting device (50–65), by means of which the position of the circuit board (6) is adjustable with regard to the plunger positions of the test probes (3). With a movement of the probe plate (1) towards the circuit board (6), the plungers of the test probes (3) meet the test points on the circuit board (6), and the adjusting device (50–65) affects each locating pin (5) and establishes adjustably the locating pins (5) in the moving plate (4) in a plane parallel to the plane of the circuit board.

20 Claims, 15 Drawing Sheets

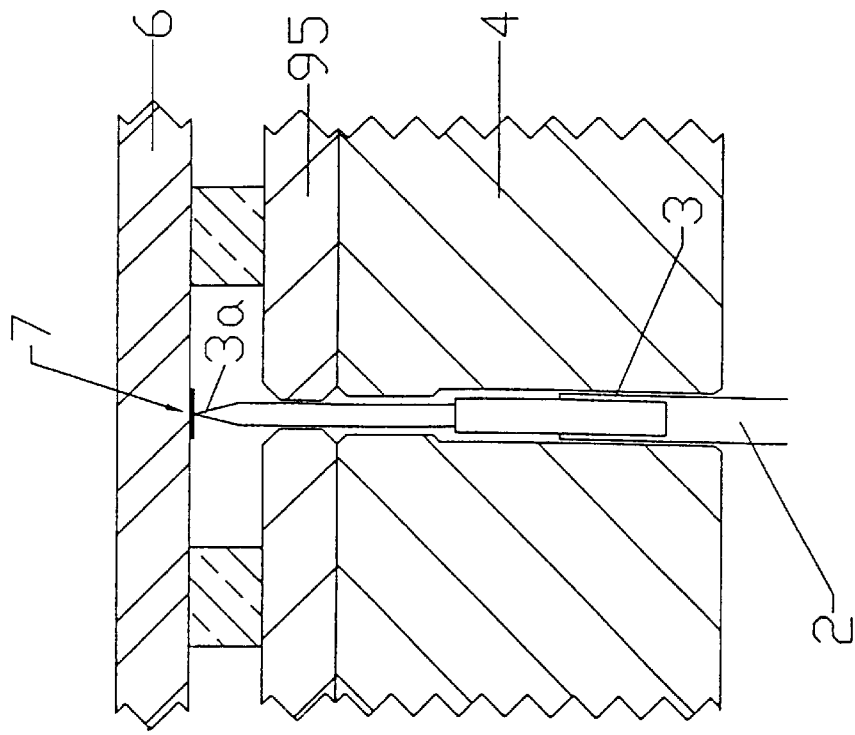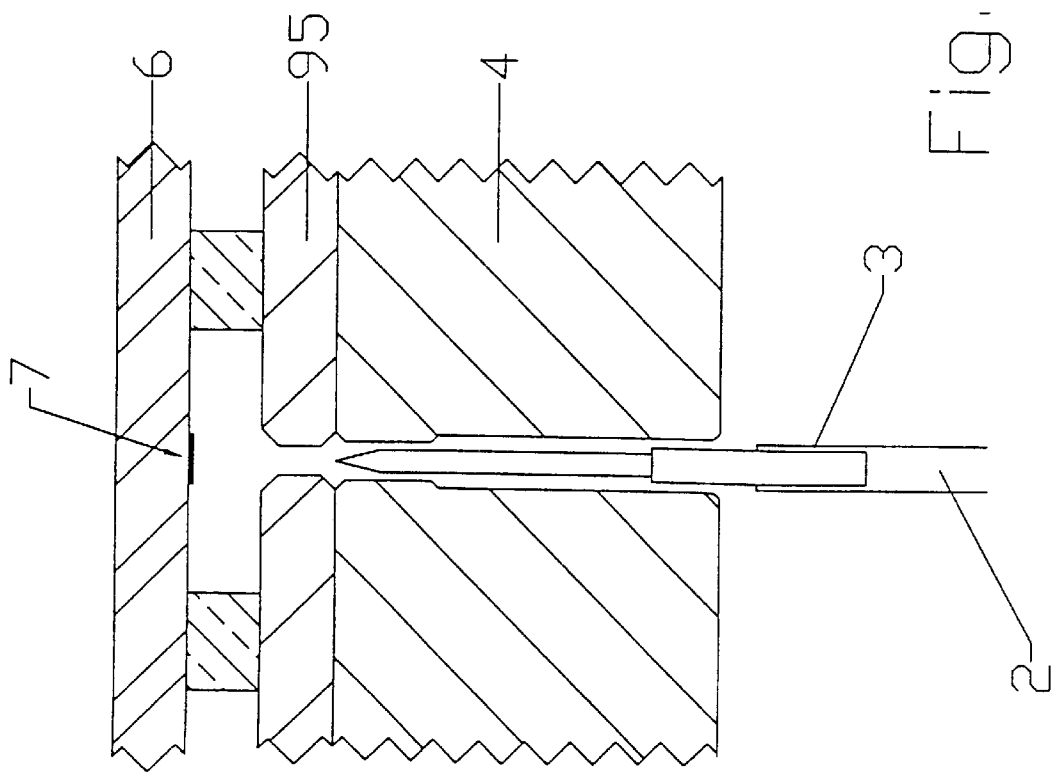
Fig. 12

LOAD BOARD TEST FIXTURE

The present invention concerns a test adapter according to the generic term of claim 1.

BACKGROUND OF THE INVENTION

Test adapters are used in series production of loaded and unloaded circuit boards in the field of test and repair and serve for simultaneous contacting of a great plurality of contact locations of the circuit board by an automatic test system. FIG. 3 shows a typical construction of a conventional test adapter. The test adapter comprises a probe plate 1 and receptacles 2 mounted on this plate as well as exchangeable inserted test probes. The test probes 3 have one top called plunger 3a for the contact with test points 7 of a circuit board 6. The circuit board 6 is mounted on a moving plate 4 of the test adapter by the locating pins 5. Usually the circuit board 6 is pressed against the test probes 3 by vacuum or a hold-down technique not drawn in here, the moving plate 4 performing a vertical movement in the direction to the probe plate 1.

Usually in accordance with each test method and size of circuit board the test points 7 assigned to between a few hundred and a few thousand test probes are contacted on the circuit board 6. Here a particularly high economy is offered by the in-circuit-test-method, where, however, all nets of a loaded circuit board have to be contacted each with at least one, in a few cases also several test probes. In order to reach reliable contacting whether special contact surfaces (test pads) are provided on the circuit board in case of nets with only surface-mounted components, or, if possible, existing plated through holes are used. In case of the through hole insertion technique of components decreasing in distribution the connection points of the components can be contacted reliably.

The progressing miniaturization of electronic assemblies requires on the one hand a reduction of the minimum diameter of test pads and plated through holes, which is necessary for the contacting, but on the other hand also the possibility to contact ranges of contact previously not contactable as for instance contact areas of surface-mounted components or thin circuit lines. Just in case of the second requirement very great demands are made on the positioning accuracy.

Here the size of the necessary test contact surfaces depends mainly on the sum of the tolerances of the test probes, on the guidance of the adapter system and on the dimensional stability of circuit board 6. The factors influencing the size of the necessary test surface on circuit board 6 can be subdivided into three groups:

A first error group, which makes up a considerable portion of the total error, is formed by the mounting-caused misalignment of the receptacles 2, which receive the test probes 3, as well as the wobbling clearance of the test probes themselves.

The second important error group concerns the manufacturing or processing-caused deviation of the dimensional stability of circuit board 6. The most important consequences are the misalignment between hole pattern and circuit line pattern, which is directly reflected as misalignment of the test points with regard to the reference holes of circuit board 6, as well as a stretch or shrinkage of the entire circuit board 6 as also of the circuit line pattern 10 with regard to the hole pattern. Furthermore an angular displacement between hole pattern and circuit line pattern forms a source of error of this second error group.

FIG. 2 shows the consequences of the misalignment between hole pattern and circuit line pattern. This misalignment is discernible in FIG. 2 by the non-centric position of the bore hole 24 referred to copper ring 21 surrounding the bore. The same misalignment causes that the drawn-in distance a between mounting hole 20, through which circuit board 6 is fixed on the moving plate 4, and test point 23 shows a deviation and with this a test probe 3 lined up relatively to the center of the receiving hole 20 does not meet the contact point 23 whether at center or does not meet it at all, depending on the size of the contact point.

The third error group results from the guidance of circuit board 6 over the tightly positioned locating pins 5. In order to even out the tolerances of locating pin 5 and receiving bores 20 in circuit board 6 as well as to even out the above named errors of dimensional stability of circuit board 6 the diameter of the locating pins 5 has always be chosen in a manner that a clearance fit is always achieved. Such a clearance fit causes inevitably an positioning error.

It has to be taken into consideration at all sources of error that particularly in case of high production rate circuit boards are got from many different, internationally producing manufacturers, so that close cooperation with the manufacturer in order to reduce tolerances is made more difficult and hardly takes place in practice. Furthermore in an ideal manner automatic or at least easily manageable semi-automatic correction methods are necessary for a running production, because complicated manual correction of occurring tolerances is not compatible with the requirements of the running series production.

Test adapters being aimed in particular at the correction of the above named second error groups, i.e., of the misalignment errors of the board, are known from several patents. In the U.S. Pat. No. 4,820,975 a test adapter with shiftable probe plates is described, where the misalignment is determined by the measuring of reference marks by means of video cameras, and this error will then be adapted automatically over the xy-shiftable probe plate.

An alternative of this solution that requires a lot of technique is the test adapter described later in U.S. Pat. No. 5,321,351, where the locating pins for the circuit board are mounted adjustably and where a justage of each production of circuit boards is also done by the evaluation of reference marks with video cameras.

This test adapter, however, has the disadvantage that the adjusting mechanism for the adjusting pins is only suited to individual adjustments by means of the special adjusting circuit board, so that manual or automatic adaptations within a series of circuit boards cannot be performed. An additional disadvantage results from the locating pins fixed in the probe plate, if, caused by small receiving holes, locating pins with little diameter are needed. In this case the unfavorable relation between diameter and length of the locating pin causes a very low stability. It is a further disadvantage of this version that locating pins fixed in the probe plate abruptly pierce the circuit board at suction of the adapter and thus require additional protection measures to meet the safety regulations.

These three named disadvantages were then removed in the further development according to U.S. Pat. No. 5,408,189. Here the locating pins are tightly fixed in the moving plate, and this can be adjusted continuously over driving elements in relation to the probe plate. In this version, however, the through holes of the spring contact pins through the moving plate must be particularly big, so that for example due to the construction an additional guiding of the plungers in the moving plate is not possible. All three described test adapters are based on the principle that the positions of the circuit board and the one of the receiving bores of the spring contact pins in the probe plate are shifted relatively to each other and that the reference measurement is also carried out between probe plate and circuit board by means of video cameras. Thus the initially described error portions caused by mounting misalignment, wobbling clearance of the probe and clearance of the receiving holes are not taken into consideration and therefore they limit the achievable positioning accuracy. Furthermore for setting up a special adjusting board (golden board) and a complicated setting-up process is necessary, which, for instance, is described in detail in U.S. Pat. No. 5,321,351. Because furthermore the special adjusting plate is not included in the usual schedule of parts supplied by the manufacturer of the circuit boards, considerable additional problems of procuration result possibly.

A further disadvantage at all three named solutions has its roots in the manner of the measurement of misalignment over special reference marks. While with concern to the manufacturing of circuit boards the reference marks described partially in the applications were formerly in the usable inner fringe of the circuit board, in the meantime these reference marks have been moved nearly completely to the outer fringe that is only available in the manufacturing of the circuit boards and is milled off in the completion of the unloaded circuit board. Also the alternative reference marks mentioned in the patent specifications U.S. Pat. Nos. 5,321,351 and 5,408,189—such reference marks for the correction of the component parts are known, for instance—are mostly available only on the top of the circuit board, but very often not on the underside of the circuit board provided most frequently for test contacting. For universal applicability of the method it would be necessary therefore to require on all layouts of boards appropriate reference marks on each contacting side of the adapter. This makes a change of the existing and known design guidelines about circuit boards necessary. To carry through such changes of guidelines is very difficult and lengthy as experience shows.

A further disadvantage of the named solutions results from the necessity of using video cameras at small and therefore spatially very narrow circuit boards. Such video cameras are very expensive in case of small dimensions. Also the light guides with rearrangeable video cameras proposed in the existing solutions are very costly, inter alia because for picture transmission not only one individual optical fibre, but only a fibre bundle is suitable. Separable plug connections for fibre bundles are cost-intensive, too.

For applications in the test of unloaded circuit boards from the German registered pattern DE 29616 272 U1 and from the European application for patent EP 0 859 239 A 2 solutions are technically known, where a correction of the displacement is effected by means of jointly shiftable locating pins. But because in the test of unloaded circuit boards not all error groups are relevant, it is not possible to transfer the solutions to the test of loaded circuit boards. It is one of the most important differences that loaded circuit boards are exposed to an additional heating by soldering, which can lead to stretch, shrinkage or distortion of the loaded circuit board. The locating pins fixed on a joint plate in both solutions are not shiftable from each other independently and therefore they cannot correct a part of the errors. It is a further disadvantage of both solutions that an additional plate would be necessary in the probe field of the test adapter, which reveals in case of use in test adapters for loaded circuit boards considerable disadvantages.

OBJECTS OF THE INVENTION

It is the task of the present invention to supply a test adapter, where the present disadvantages are removed and where by simultaneous correction of all important sources of error the positions of the plungers of the test probes for contact with test points on a circuit board can be adjusted more precisely.

According to the invention a test adapter with the features of claim 1 is offered to solve this task, where advantageous arrangements can be taken from the subclaims.

In particular the test adapter according to the invention comprises an adjusting device with means, which can be fixed on the circuit board and which are established adjustably in the moving plate in a direction of a plane that is parallel to the plane of the moving plate, and comprises a measuring device, which on the other hand is mounted on the moving plate and which allows the use of any circuit lines as reference by separate measuring positions for the x- and y- portion of the offset. It is an advantage of this adjusting device of the test adapter that the circuit board is shiftable relatively to the plungers of the test probes and relatively to the moving plate with the passage bores provided for the test probes. By this it is possible to design the through bores in the moving plate with very little clearance, so that a guidance of the test probes through the through bores is possible, what can considerably reduce the wobbling clearance of the test probes. By simultaneous correction of all important errors the contacting result of any circuit board from the running production, which can be easily recorded by means of a measuring microscope, can then be used for the first setting, so that there is no necessity of a special adjusting board. A further advantage results from the mounting of the locating pins in the moving plate, because this way a sufficient stability is ensured by the little length of the locating pins also in case of a little diameter.

In an advantageous manner the means comprise two locating pins, each one end of which can engage with the bore holes of the circuit board and each other end of which is established in the moving plate adjustably by means of an adjusting mechanism. Here one locating pin can be movable by means of the adjusting mechanism in two vertical directions parallel to the plane of the circuit board, and the other receiving pin can be movable by means of the adjusting mechanism in one direction and can be movable in the direction vertical to it being guided by a spring-loaded element. It is advantageous in this version that the clearance of the locating pins can be evened out in the receiving holes of the circuit board, so that errors of the third error group named before can be corrected.

Further in accordance with the invention the movement of the adjusting device can be accomplished by means of a motor, and control can be provided for the motor, which controls the motor, dependent of signals of the sensors, so that the adjusting device is adjusted in an automatic control loop. It is advantageous in this version that errors of every circuit board can be recorded by means of the sensors, and the adjusting device can be adjusted automatically by means of the motor. Furthermore the movement of the adjusting device can be also effected additionally or aloneover adjusting hand wheels provided manually with scales. This version allows a particularly easy and reproducible adjustment of the circuit board relatively to the test wheels. Thus in this case the locating pins of the adjusting device are not adjustable only one time, but they can be re-adjusted continuously.

In a further version of the test adapter according to the invention guide receptacles are provided for the test probes in the passages of the mounting plate. Furthermore a guide plate can be arranged on the side of the mounting plate, which faces the circuit board. This guide plate has guide bores at the through bores of the moving plate. By these measures errors of the first error group (mounting tolerances and wobbling clearance of the test probes) can be corrected.

The sensors of the test adapter according to the invention can be sensors, which sense for one, at least one direction the position of a line or line edge. These can be movable point sensors or movable optical reflex sensors, where the movement of the sensors can be carried out through the movement of the probe plate towards the circuit board. Such point and reflex sensors are spatially very small and considerably more economical than picture picking-up devices, which pick-up a reference picture. By the movement of the sensor and the mathematical evaluation of the signal of this sensor measuring errors can be detected, and at the same time changes of the optical parameters as for instance another shade of the solder resist or another base material of the circuit board can be detected automatically and can be taken into consideration.

Another version of the sensors results from conducting surfaces tightly mounted on the circuit board supporting plate, so that the offset can be evaluated over electrical parameters as capacity, inductivity or capacitive and inductive coupling between a circuit line of the circuit board and the surface fixed on the test adapter.

In an advantageous manner the sensors are arranged near the center of the circuit board in each case. It is the advantage of this arrangement that along with the offset of the hole pattern with regard to the pattern of the circuit line an optimal adaptation to stretch and shrinkage of the circuit board can be effected. In particular an optimal correction can be achieved by this in case of linear expansion or stretch.

Furthermore by means of the sensors of the test adapter according to the invention certain circuit lines (tracks) or circuit line edges of the printed circuit wires of the circuit board may be detectable locally. For this the sensors and the adjusting device are connected in an advantageous manner with an evaluation device, which compares the positions of certain circuit lines, circuit line edges of the circuit board, detected by the sensors, with the corresponding theoretical positions and so determines the offset of the real circuit line pattern and transfers it to the adjusting device.

By the comparison of the really detected positions of certain parts of the switching arrangement with the theoretical positions, which may result from the CAD data for instance, it is possible to determine the offset without providing special reference marks and to correct it therefore. Furthermore by the fact that the sensors measure circuit lines (tracks) or circuit line edges of the printed circuit board, nearly any quantity of optical sensors can be mounted on freely eligible places without special reference marks being provided on the circuit board at these positions. By this further errors as for instance angular errors can be optionally detected and corrected or several positions can be measured also in case of circuit boards with great dimensions, and so the test of the left half of the circuit board can be carried out with other correction than that of the right half of the circuit board, for instance.

Furthermore the test adapter according to the invention can comprise three sensors for the detection of the offset and for the turn of the circuit line pattern to the bore holes.

Furthermore a test adapter according to the invention is offered, where two test adapters according to the invention are arranged on both sides of the circuit board to be tested, each of the adjusting devices making possible an independent setting of the test adapter with regard to each of the switching arrangements on each of the sides of the circuit board. The present invention is now illustrated with embodiments with reference to the drawings.

BRIEF DESCRIPTION OF THE DRAWINGS

FIG. 12 shows guiding of the probe with separate guide plate

DETAILED DESCRIPTION

Figure 3:
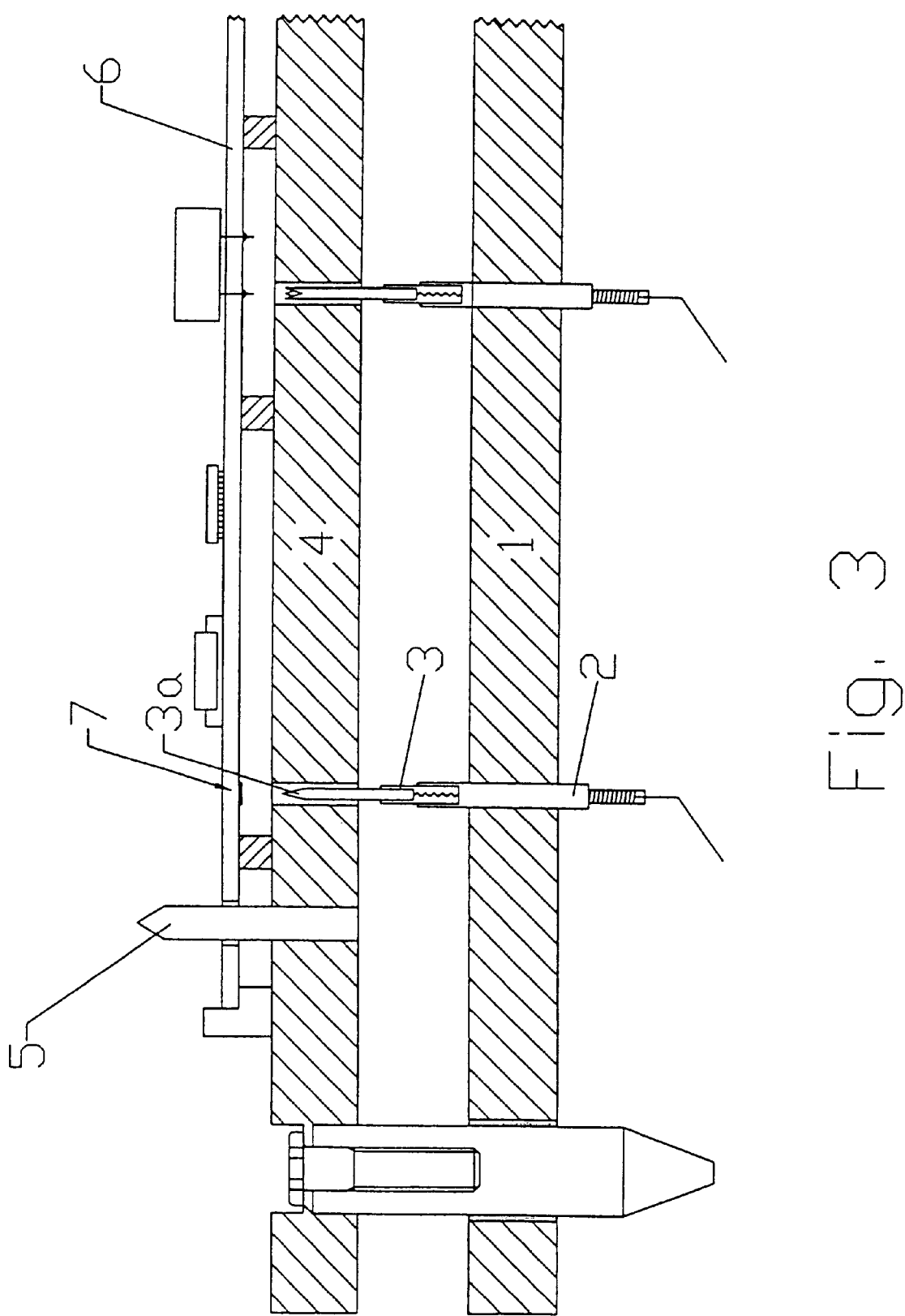
FIG. 3 shows the schematic design of a test adapter of the state of the art technology

The typical design of an adapter system with the probe plate 1 and the receptacles 2 mounted on this plate as well as spring loaded contact probes 3 inserted exchangeable, the moving plate 4 with locating pins 5 for the circuit board 6 to be tested and loaded with components is shown in FIG. 3. Here circuit board 6 is pressed by vacuum or by a hold-down technique not drawn in here against the probes, the moving plate generally performing a vertical movement in the direction to the probe plate.

Figure 1:
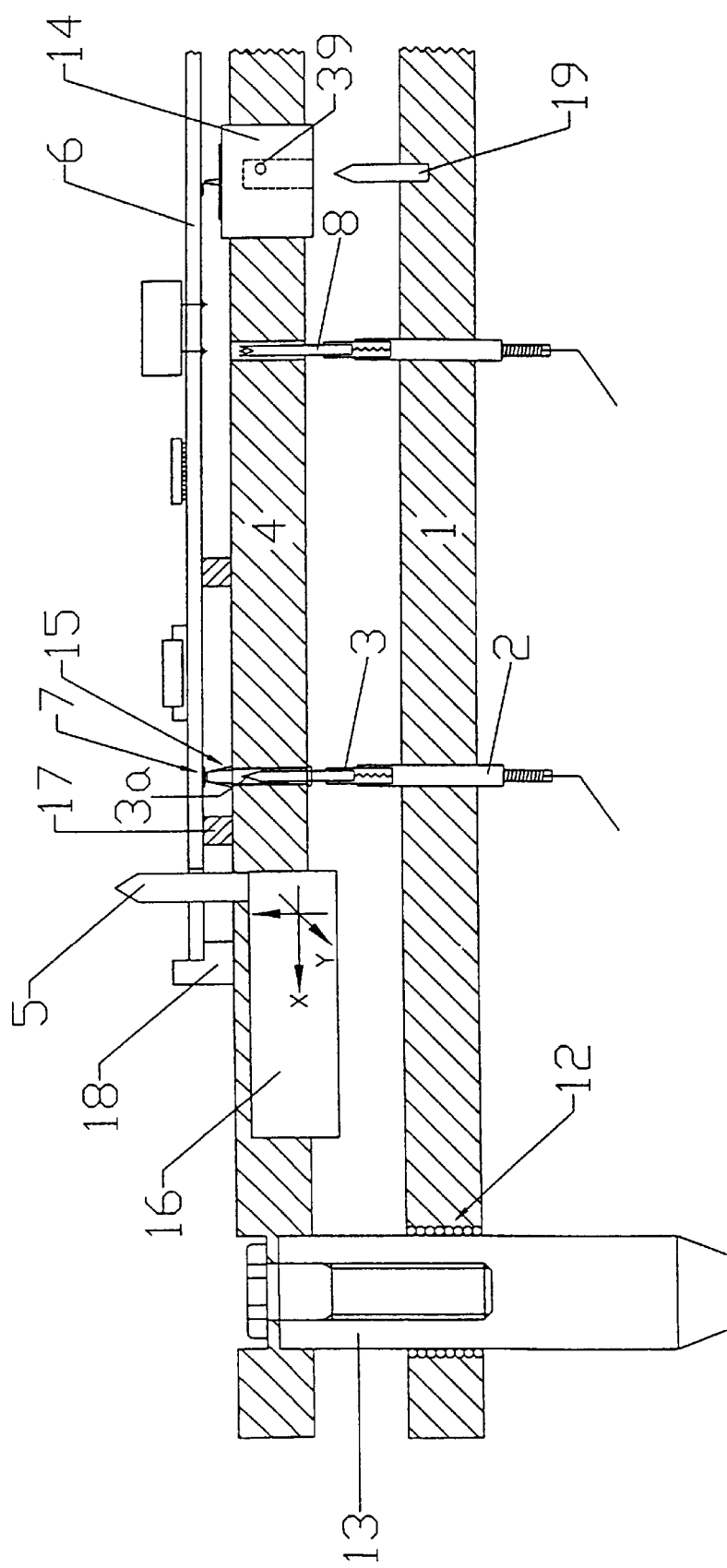
FIG. 1 shows a test adapter according to a embodiment of the present invention.
Figure 2:
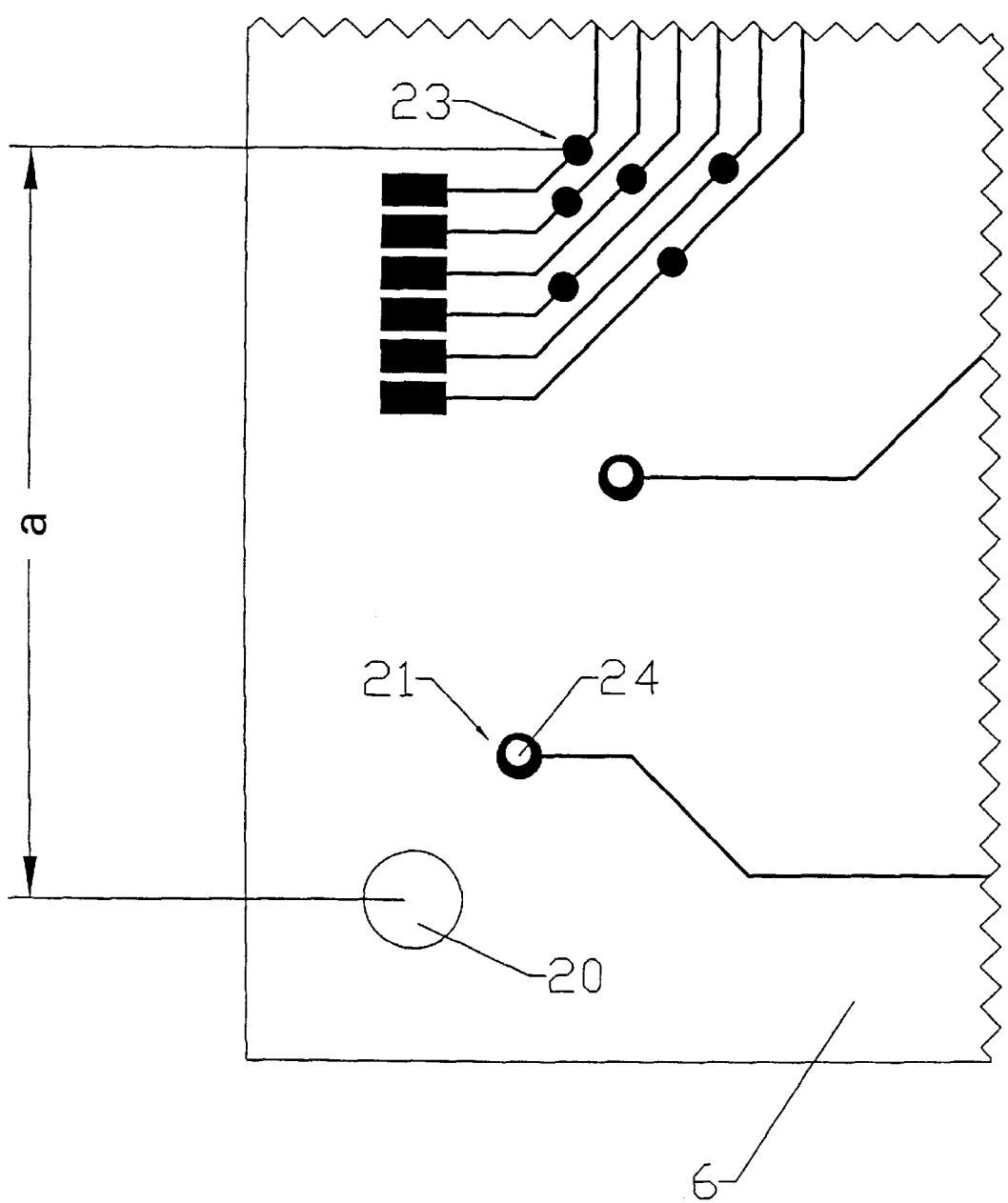
FIG. 2 describes the effect of an offset between the pattern of the circuit board and the hole pattern.

FIG. 1 shows with respect to the invention an extension of the basic concept described already in FIG. 3, where the existing locating pin is replaced by the locating pin 5 adjustable in two directions. At least two sensors 14 are arranged optionally. Furthermore the probes tapering to a point and usually provided for little test points are inserted after by a special guide receptacle 15. In conjunction with a precise guiding it is furthermore effective to carry the adapter to each other by very stable guide pins 13 and high-quality linear bearings 12.

By means of an automatic drive being useful in this function or by means of a manual drive provided with a dial-cord pulley both locating pins 5 can be shifted in the range of a few tenths of millimeters. Here it is useful to move one locating pin in both directions and to move an axle at the second locating pin by means of the driving system, a second one guided by a spring-loaded element.

The sensors 14 in the version of optical point sensors are set in the moving plate as it is useful in this function, and they are arranged that way that they determine each for one direction the position of a circuit line known from the CAD data. For this at lowering the adapter a vertical movement of the sensor is effected over the circuit line to be measured.

Depending on the number of sensors only offset, offset and turn or offset, turn and stretches the circuit board can be detected and compensated by means of the shiftable locating pins.

A simple solution of the optical detection are so-called reflex sensors, which are available as economical standard components from their use especially for the identification of bar codes. These reflex sensors contain an optical transmitter lined up by lenses to a measuring point of a diameter of about 0.2 mm and a receiver, and so they record the optical value of reflection on the exactly defined measuring point.

Figure 4:
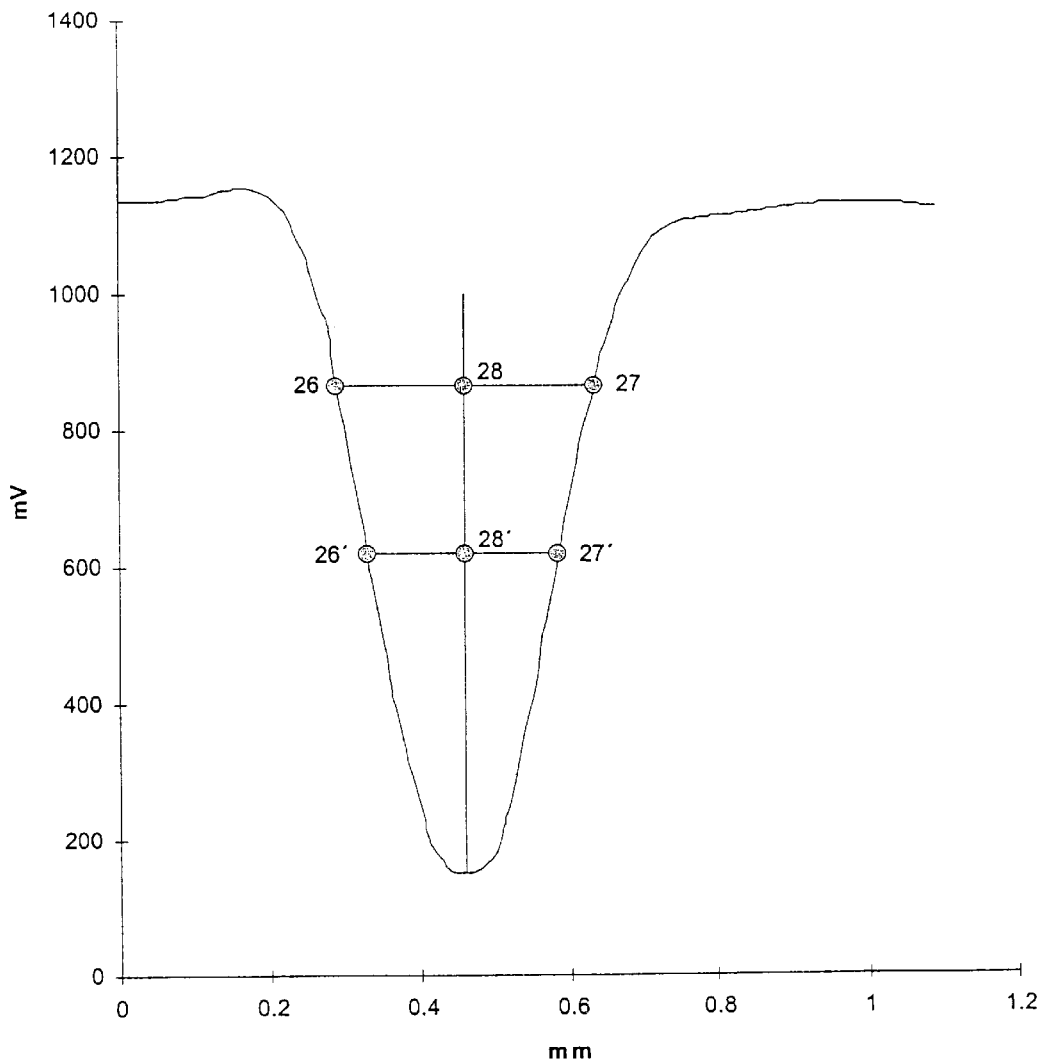
FIG. 4 shows the results of an exemplary measurement with reflex sensors of an embodiment of the invention.

Any circuit line (track) or circuit line edge can be used as object of the measurement, so that the measuring method does not have to rely on the existence of reference marks. When a reflex sensor is moved over a circuit line for instance, the course of brightness represented in FIG. 4 results, given by the sensor as value of the voltage. Here a high value of voltage represents low reflection, a low a high reflection. For the evaluation the center 28 of the connecting line 26, 27 can be ascertained by means of simple mathematical calculations with reference to one or several values of the voltage. From the length value related to on the x-axis of the diagram the position of the circuit line can be determined directly then.

It is possible furthermore by means of the plurality of evaluable measuring points (for instance in addition 26' and 27') to detect automatically faulty measurements produced by contamination or scratches and to take this into consideration in the automatic correction.

For the guiding of the probes guides through special guide bushings 15 in FIG. 3 improved according to the invention or an individual guide plate (FIG. 12) are used, which offer a more precise guide as a sheer guiding by tapered drill diameter in the moving plate, but which are encumbered with the disadvantage of high costs and a double contacting location of the spring contact pins guided in two stages (according to the U.S. Pat. No. 5,510,722 already mentioned above).

It is an essential advantage of the present invention that all important sources of error can be compensated at the same time during the positioning of probes of test adapters:

a) the offset between circuit line (track) pattern and hole pattern by measuring and correction of the offset.
b) sources of errors caused by probe guide and guiding of probe in the moving plate or in an additional guide plate or by using probes with two-stage design
c) errors because of tolerances of the fit of receiving hole and locating pin by means of a locating pin guided in one direction as spring-loaded
d) minimization of errors from stretching or shrinkage of the circuit board by positioning the sensors in the circuit board center referring to the axis
e) additional compensation of angular errors by means of at least one further reflex sensor Furthermore, in order to achieve a very high accuracy the first setting can be carried out by means of a master circuit board, i.e., without additional adjusting means. Because with the exception of the misalignment between circuit board and locating pins error portions constant to a large extent (caused by mounting and boring) influence the adjustment, the misalignment of the sticking-in points of the probe plungers in the circuit boards can be measured now by means of a measuring microscope once as deviation on several reference locations and can enter the control process as a correction value.

Figure 5:
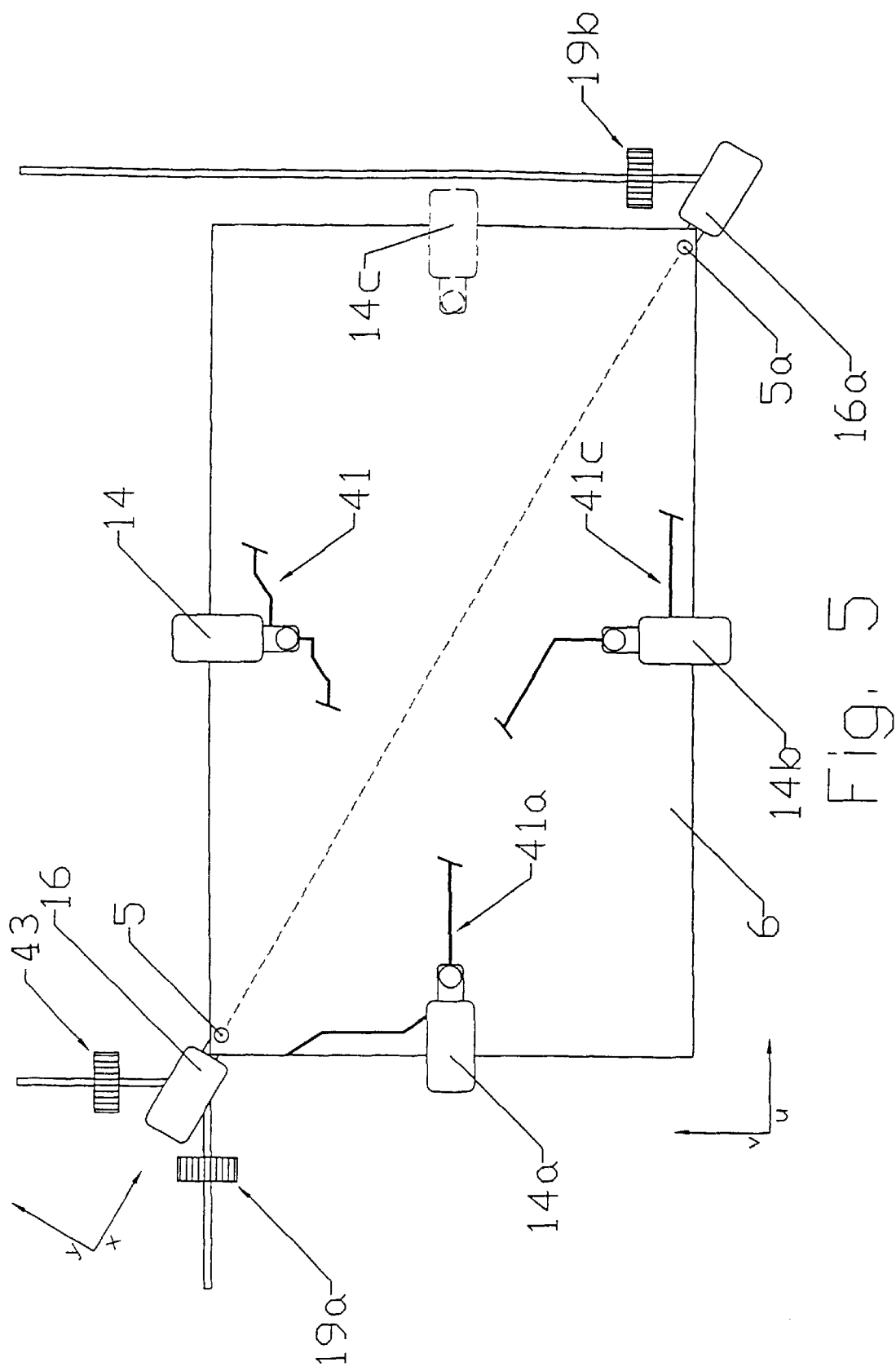
FIG. 5 shows the arrangement of the sensors for the detection of various causes of error

FIG. 5 shows the arrangement of the adjustable locating pins and sensors for the compensation of the offset of the circuit line pattern and the optimized adaptation to shrinkage or stretching as well as the compensation of the errors caused by the receiving holes. For description two separate coordinate systems are designated. Coordinate system XY is determined by the diagonal connection of the locating pins, coordinate system UV is right-angled to the loaded circuit board to be contacted. The loaded circuit board 6 is put on the locating pins 5 and 5a and held in position by the spring-loaded reception 16a right below in x-direction. With regard to the locating pins a total offset results, which results as sum of the offset of the circuit line and of offset of the receiving hole. This offset is determined for U-direction at sensor 14 by measuring the circuit line position 41 and is converted into a deviation in X- and Y-direction by means of the known coordinates of the locating pins and sensors.

Figure 6:
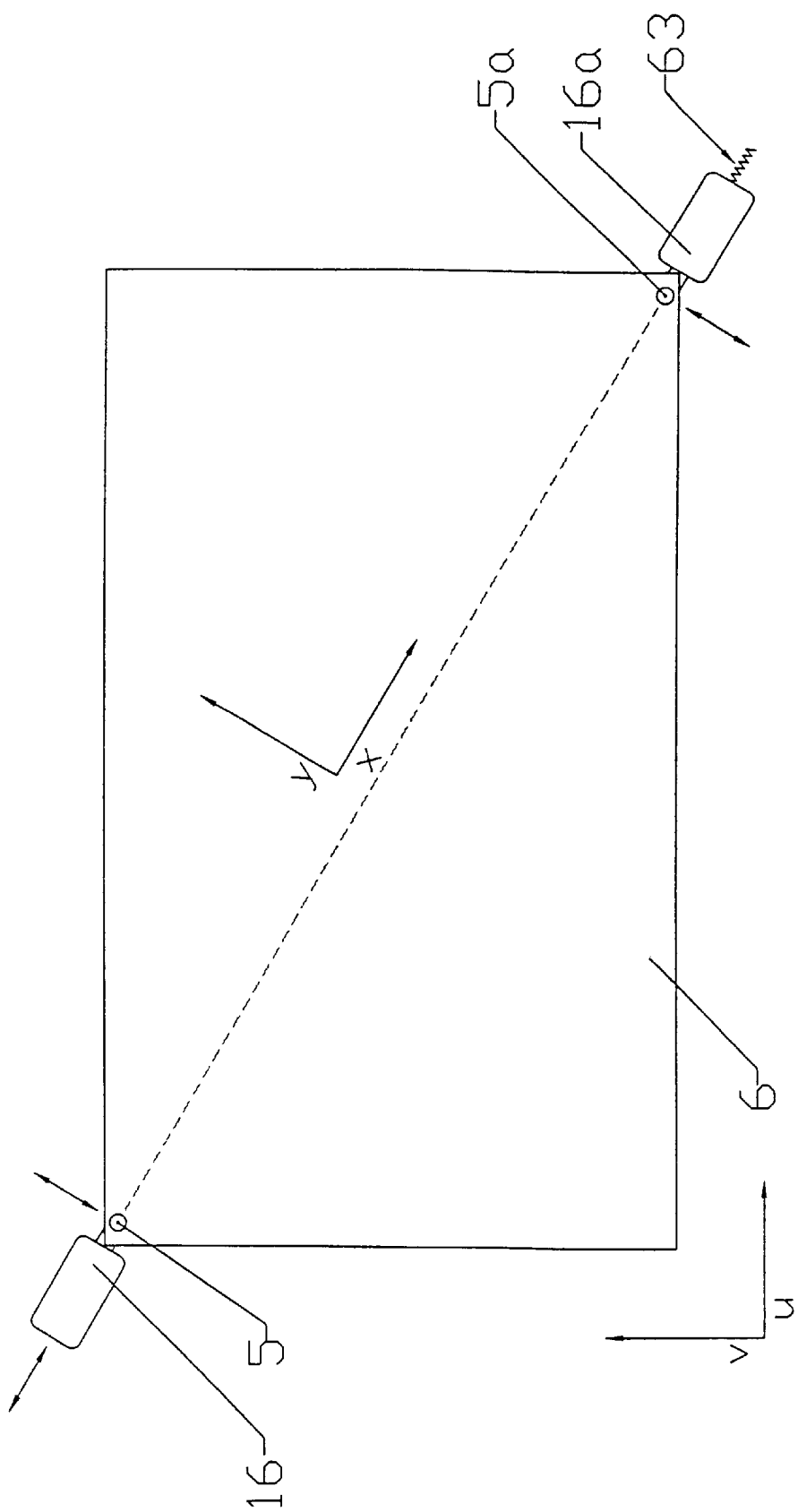
FIG. 6 shows an arrangement of the locating pins with a pin adjustable in two axial directions and with a locating pin adjustable in one axial direction and spring-loaded in the second axial direction

FIG. 6 makes clear, how the above named errors of error group 3 are taken into consideration by two adjustable axles on the one side and an adjustable and one spring-loaded axle on the other side. By this arrangement the circuit board is always held in a defined position by the spring also in case of alternating distance of the receiving holes. So the error arising here is compensated automatically along with the correction of the offset.

In case of an error in Y-direction the adjustment is performed by both Y final control elements 43 and 19b (FIG. 5) in the same direction. An error in X-direction is compensated by the X final control element 19a in conjunction with the spring-loaded second X-guide 16a.

In case of additional errors caused by stretch or shrinkage it is a useful strategy of correction here to adjust the position that way that contact locations are contacted at center in the center of the circuit board and the outer contact locations are contacted in opposite direction, but offset. This strategy is fulfilled automatically, if the sensors are arranged in the center of the circuit board and it is supported according to the invention, because any circuit line segment can be selected as reference and therefore a central positioning referring to the axis can be realized easily.

An optional third sensors 14b allows the additional detection of a turn, because the difference in offset between sensor 14 and 14b represents a direct measure for the determination of this turn. Even if no appropriate positions can be found for the sensors 14 and 14b (equal U-value is ideal), a sufficiently exact measurement of the turn is possible also in case of little offset of the U-values of sensor 14 and sensor 14b because of the knowledge of the exact coordinates. Besides it is possible to choose instead of position 14b a position 14c and then to carry out the measurement of the turn between the sensors 14a and 14c.

In case of circuit boards with great dimensions or large circuit boards manufactured as a panel of single boards it is advisable to arrange several pairs of sensors or triples of sensors that way that one pair or triple in each case is assigned to a range. Here the test could be subdivided into two or several stages, depending on the position of the components, and the correction could be switched over between the tests.

Furthermore in case of high requirements to accuracy mechanical changes caused also by environmental conditions (temperature, atmospheric humidity) are crucial. Therefore it is useful to operate test systems and test adapters in air-conditioned areas or to record temperature and atmospheric humidity by means of measurement technology and to take this into consideration in the software-aided calculation of the correction.

Figure 7:
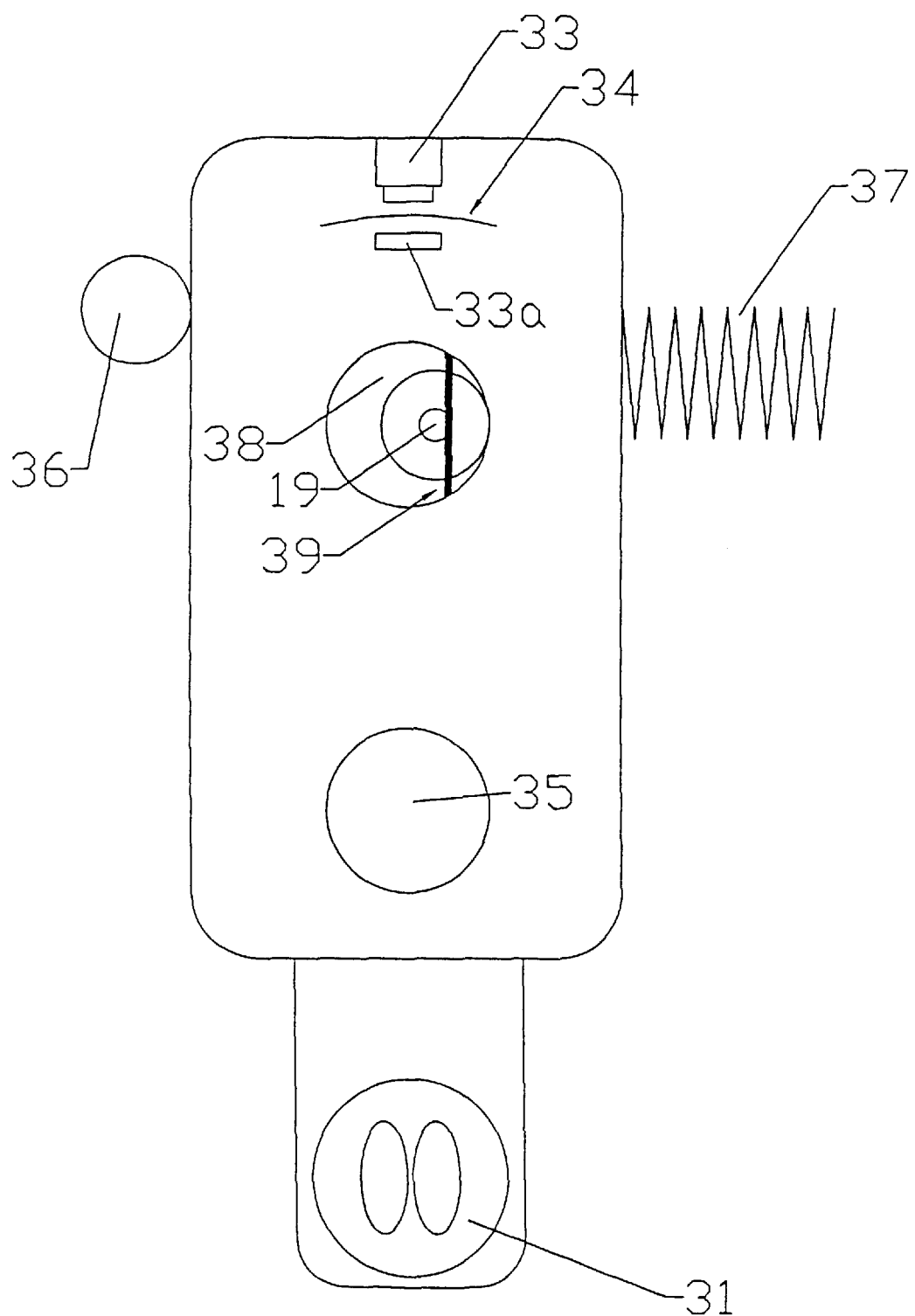
FIG. 7 shows as a detail the design of the sensors according to a embodiment of the invention.

A useful embodiment of the offset sensor is described in FIG. 7.

The offset sensor consists of a unit with optical reflex sensor 31 rotatable around rotation axis 35, a mechanical turning assembly 38, 39, and optionally from a simple path measuring system with forked light barrier 33 and 33a and a line strip 34. By means of spring 37 and the stop pin 36 the sensor is held in position of rest, where the position is determined that way that the center of the sensor is situated before the beginning of the selected circuit line.

The rotary motion necessary for the reception of the reflection values of the circuit line can be effected optionally by the own drive, but also by the lowering motion of the test adapter. In case of the second solution represented here and particularly simple the pin 19 mounted in the probe plate 1 and tapering to the point (see also FIG. 1) causes a slight rotary motion of the sensor in case of lowering over cotter pin 39. Here the rotary motion can be adjusted over the mechanical dimensions that way that the measurement is effected only in the second part of the lowering motion. In this case the the circuit board is then already tightly pressed against the seal 18 and the spacer 17 and lies planely on top.

The position of the sensor is chosen that way that the measuring line detects a complete width of the circuit line vertically to the course of the circuit line. The measured values are stored and evaluated by a computer-aided system. For the triggering of the measurement system it is useful to generate pulses, which are produced linearly to the lowering motion. It is particularly useful to produce these pulses immediately at the measuring point, because that way a differently fast lowering of the moving plate on various places does not cause measuring errors. A useful arrangement for the generation of trigger pulses is the combination of a forked light barrier 33, 33a with line strip 34 mounted tightly on the circuit board supporting plate.

In principle a correction of the position of the test adapter is only possible, if the circuit board to be tested is not sucked or pressed on the probe field. With this at first glance an additional time needed results for a first suction of the specimen, measurement, unloading of the specimen and correction of the position.

However, it can be achieved by an appropriate arrangement of the course of the measurement that this additional time needed is only seldom necessary. Hereby use is made of the fact, too, that most of the test systems can also record a faulty contacting by means of measurement technology, and circuit boards of the same production batch have frequently a similar offset.

Figure 15:
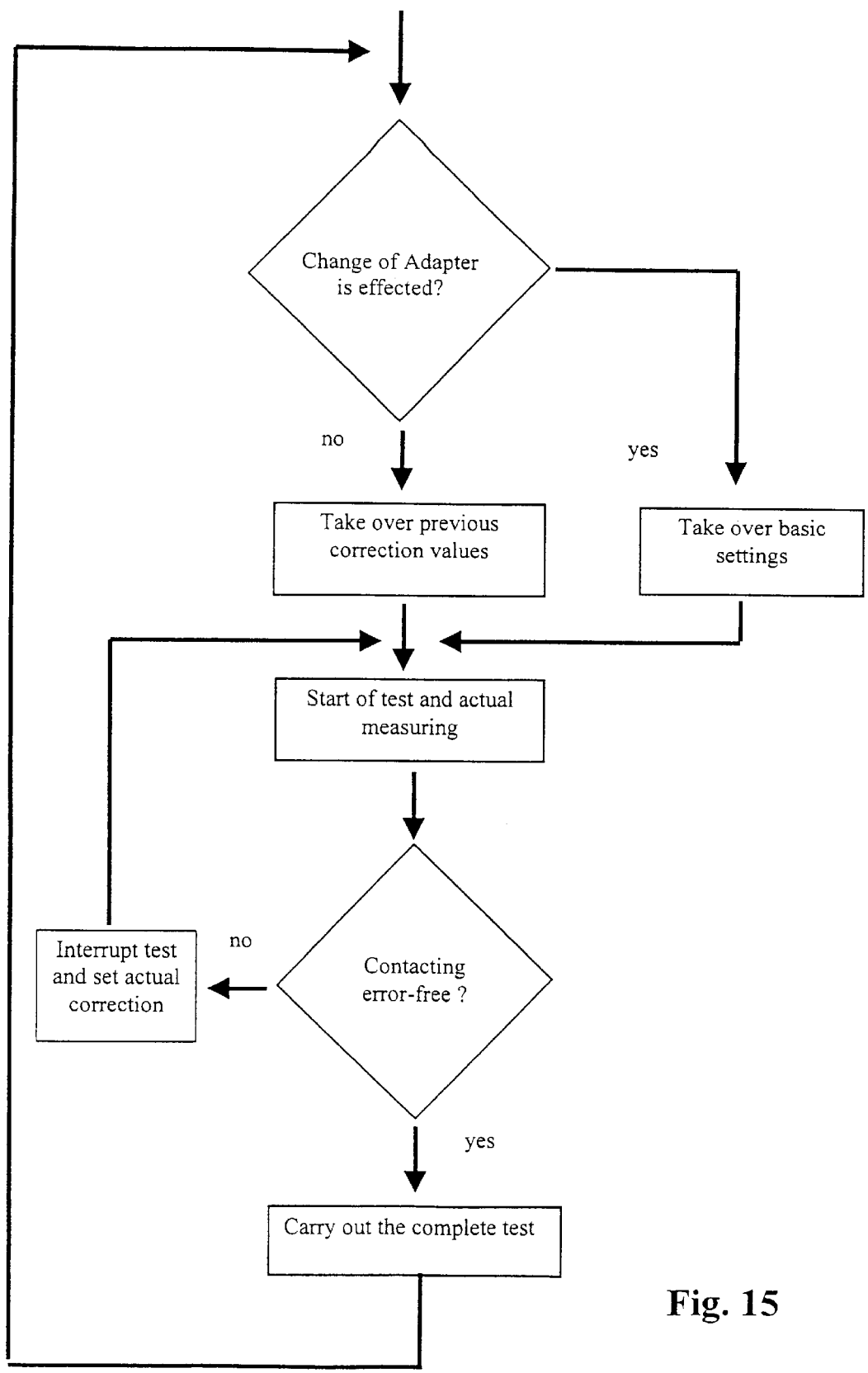
FIG. 15 shows the course of measurement and correction in conjunction with the test adapter according to the invention

FIG. 15 describes the course of measurement and correction of error

Here, after a change of the test adapter, i.e., at the beginning of a new series of circuit boards at first stored basic adjustment are taken over. If the contacting with this adjustment is error-free, the test runs to the end without temporal delay. Only in case of a contacting error a correction is effected on the base of the correction values actually ascertained. The in any further series of circuit boards the correction values of the previous circuit board are taken.

This method is useful particularly then, as mentioned before, when circuit boards are manufactured in a batch process and are used in the production. Here one has to expect that circuit boards following behind one another have a similar offset and a continuous adaptation will be sufficient.

If in case of repairs for instance, circuit boards of other batches get into the manufacturing in individual cases, the automatic correction in conjunction with the contacting starts and causes automatically a re-contacting with right offset. Concerning the version of the shiftable locating pins a particularly simple solution results from the realization of the XY-movement by a linear and a rotary motion.

With the software used in the overall application as in case of manual as also in case of automatic adjustment the user receives automatic values correctly calculated and therefore he is not concerned by the necessary arithmetic operations.

Figure 8:
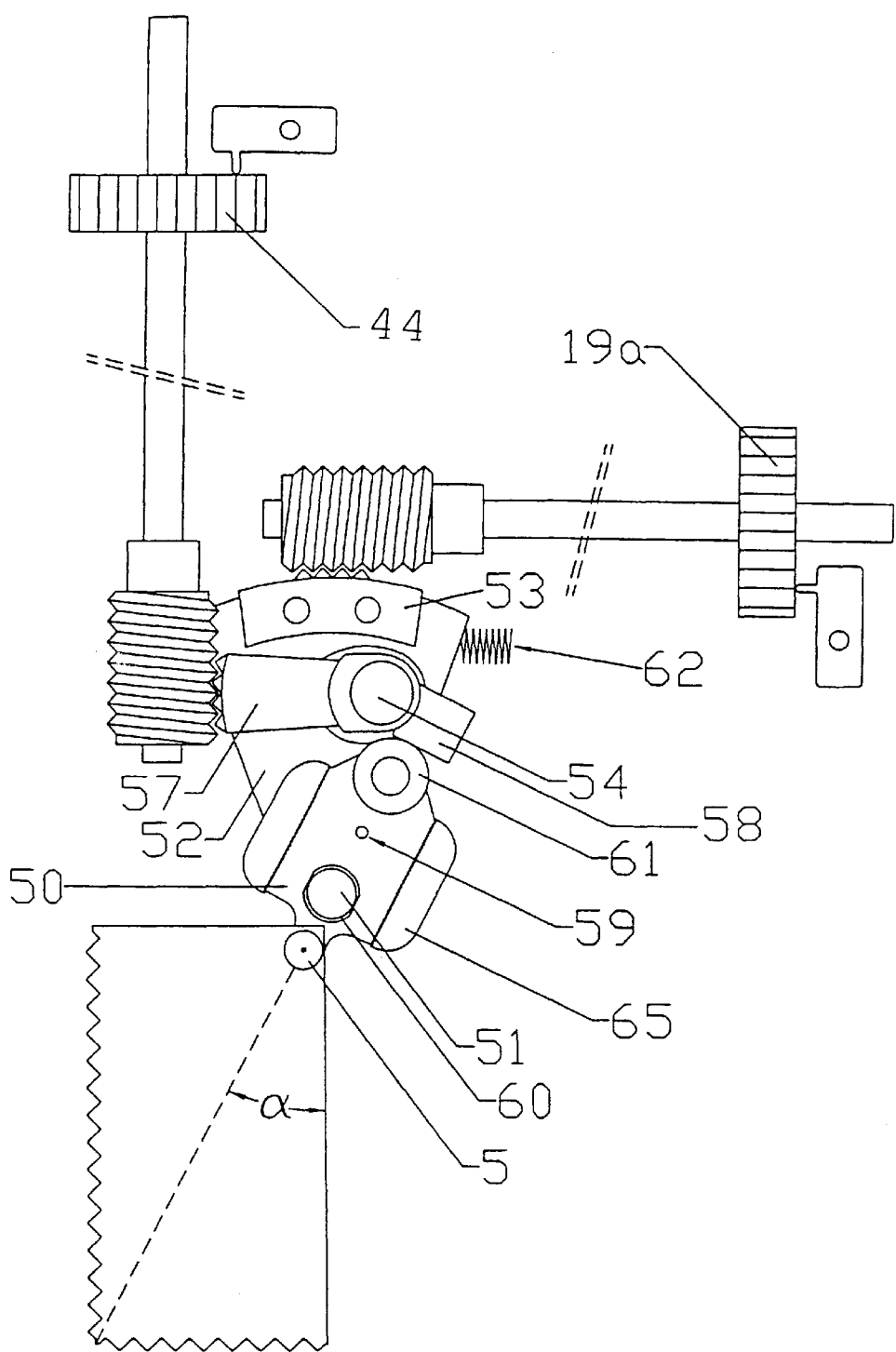
FIG. 8 shows the design of the adjustment mechanics of the setting device of a practical example of the invention.

FIG. 8 shows the design of a locating pin unit, where in accordance with the requirements a backlash-free adjustable position, very short procedures and at any angle alpha determined by the circuit board a vertical and horizontal position of the driving axles referring to the moving plate are achieved. The unit consists of a shiftable carriage 50 with the locating pin 5, a tail sheave 61 and a deep hole 63. The carriage moves with a carriage frame 65, which is carried rotatably around the rotation axis 51. On the carriage frame a supporting plate 52 is mounted with adjustable angle, and the segment gear 53 is fixed on this supporting plate. The sliding movement is derived from a second rotary motion around the axle 54, on which on the other hand the segment gear 57 is fixed adjustably in angle.

The adaptation to the angle alpha predetermined by the circuit board is effected by the adaptation of the segment gears adjustable in angle. A backlash-free gear function is realized for both axles by springs 59 and 62 preloaded in each axle. The conversion of the distance resulting from gear reduction and lever ratio is dimensioned that way that with a total rotation of 270 degrees for instance the total 30 range of distance of the locating pin is traced. By this the realization of a scale lettering, which is important in case of manual adjustment, is considerably simplified.

An element of the same design with a moved and spring-loaded axle is used for the opposite catch hole.

Figure 9:
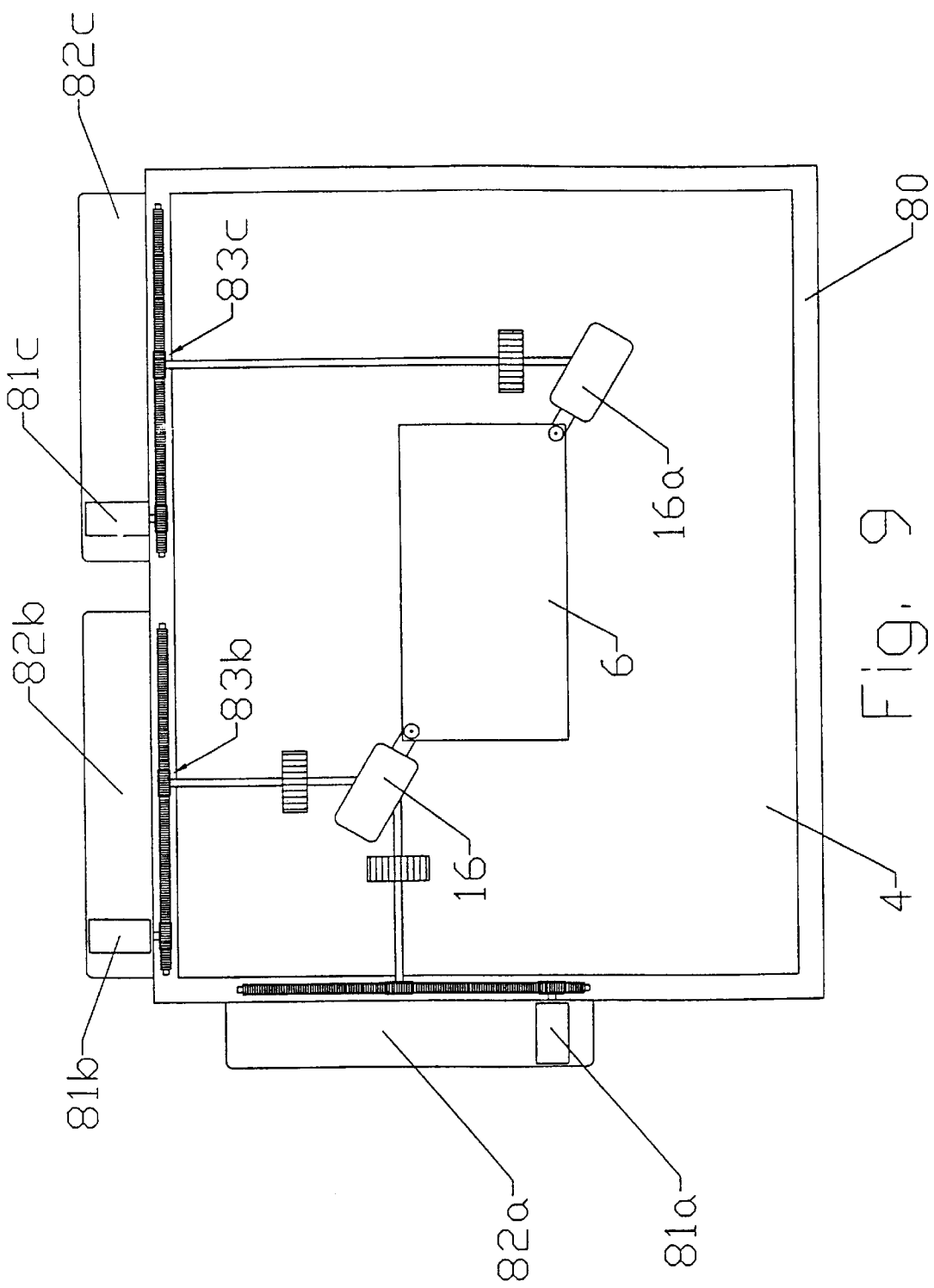
FIG. 9 shows the coupling of the adjustment mechanics with a basic device.

The worm wheel gear offers the advantage that the driving mechanism can be detached when the individual adapter is changed without the set position shifting. A particularly practical realization results in case of adapter systems, where a basic device is already used. Here the driving mechanism and control can be installed in the basic device and a decoupling can be effected with the change of the adapter by means of suitable interfaces. An example of the arrangement is represented in FIG. 9. The basic device, in which the adapters specific to circuit boards are installed, is shown as frame 80 with three mounted driving units 82a to 82c. Because the position of the adjusting units 16 specific to the adapter is different, depending on the size of the circuit board, at first a rack is moved by means of the motor units 81a–c. Then the gears 83a–c connected with the adjustment units are put on this rack and transfer the driving motion generated in the basic device to the individual test adapter.

The evaluation of the optical sensors and the control of the driving motors is then effected by the basic device, too.

Figure 10:
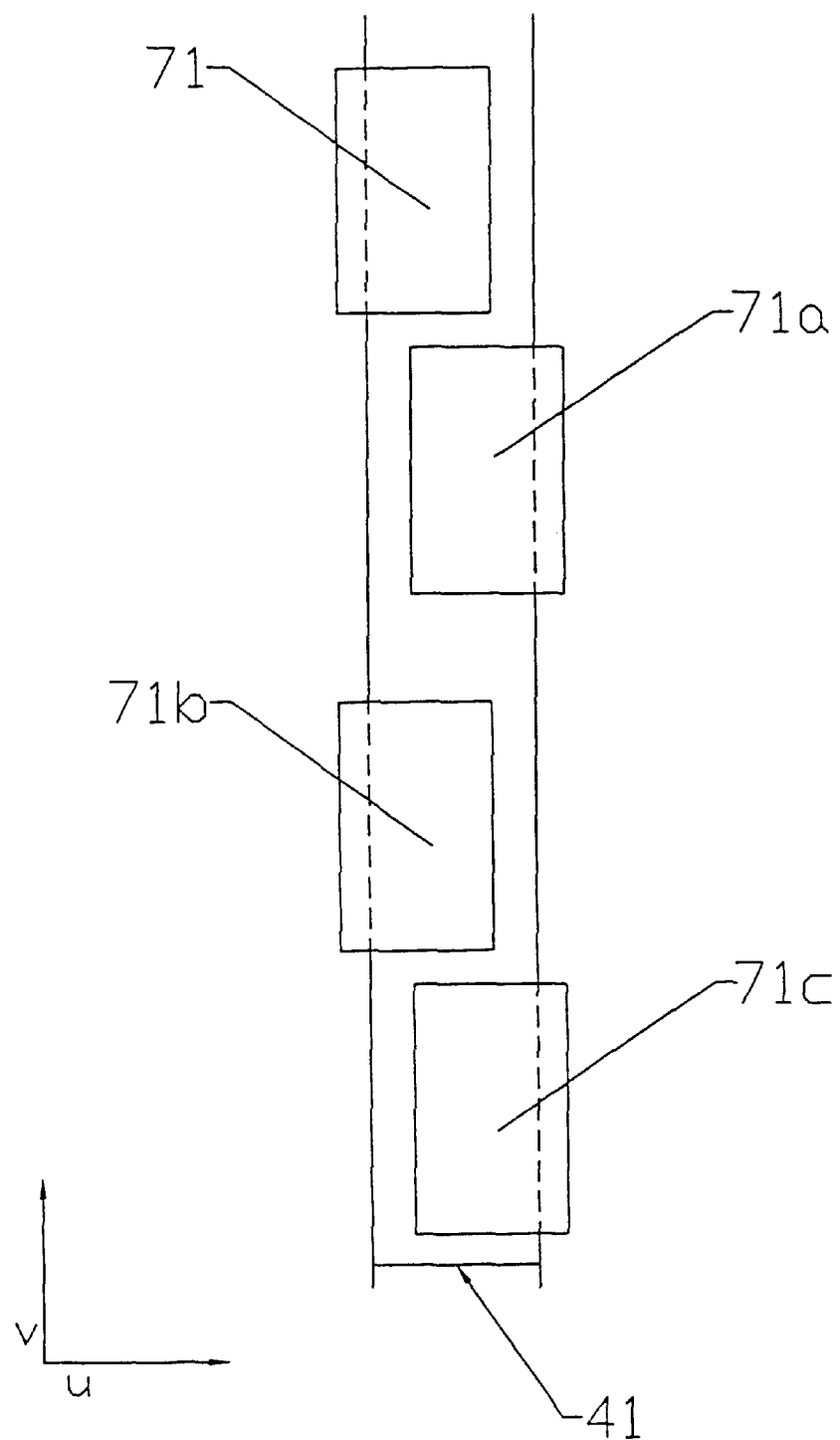
FIG. 10 shows an alternative capacitive measurement.

The above named optical measurement of the position of the circuit line can be carried out with electrical measuring methods in a modified form, too. It is a common feature of this measuring method that for every measuring position usefully two electric conductors mechanically tightly fixed get a change of the electrical measured value, which depends on the mechanical distance. This can be the capacity, inductivity or induced voltage, depending on the measuring equipment. In case of two measuring devices, which are slightly offset mechanically, the difference of the measured values can be ascertained and this way a compensation of interference factors can be effected. An example of the arrangement of a capacative measurement is represented in FIG. 10. One circuit line segment 41 of the circuit board and at least two conducting metal strips 71 and 71a mounted in the adapter on appropriate position represent in the contacting of the circuit board two capacities, which are may be little, but can be ascertained by means of the measurement technology with a justifiable lot of needed time and expenditure. Because of the little measured value of the capacity it is useful to integrate a measuring amplifier into the sensor.

In case of a correct position of the circuit line the capacity values between the metal surfaces 41 and 71 as well as between 71a and 41 are identical. In case of an offset in U-direction the displacement can be calculated from the difference of the capacity values. IF several sensors (here additionally 71b and 71c) are arranged, sources of error that influence the measurement (local errors in etching on the circuit line), can be detected and taken into consideration. In the analogy of this measurement of capacity modified measuring methods with regard to inductivity or voltage transferred by capacitive coupling, for instance, are possible.

In conjunction with the previously described offset correction it is useful, in order to achieve the very little total tolerance desired, to combine the described offset correction with a correction of errors caused by the probes. Known are methods, where by a narrowed guide bore in the moving plate or by an additional probe mounted on the moving plate a guide is effected immediately on the contact location. A further thinkable alternative of probes with very short spring deflection is not applicable at least in case of the bottom side of the circuit board, because along with smallest test points on another place component connections pushed through are often contacted, too, and a larger spring deflection is provided because of the tolerance.

The above named and often used method of narrowed guide bore in the circuit board supporting plate makes an immediate guiding to the bottom side of the circuit more difficult because of the distance between moving plate and circuit board, which is necessary with regard to components on the back. Furthermore in case of using standard probes used economically with a great number of pieces only a very short part of the thickness of the moving plate can be used for the guiding. If this guiding is worn out by longer operation, it would be necessary to renew the entire moving plate with high expenditure possibly. It is a further disadvantage of the narrowed guiding that a geometry of the bore hole on the circuit board drilling machines usually used in the construction of adapters, which is suitable for the optimal guiding, can be established only with high expenditure.

A technically improved solution is described in the U.S. Pat. No. 5,510,722 already mentioned, where an own probe is mounted on the moving plate and is directly guided there. However, disadvantages are the high expenditure and the additional electrical contact location.

Figure 11:
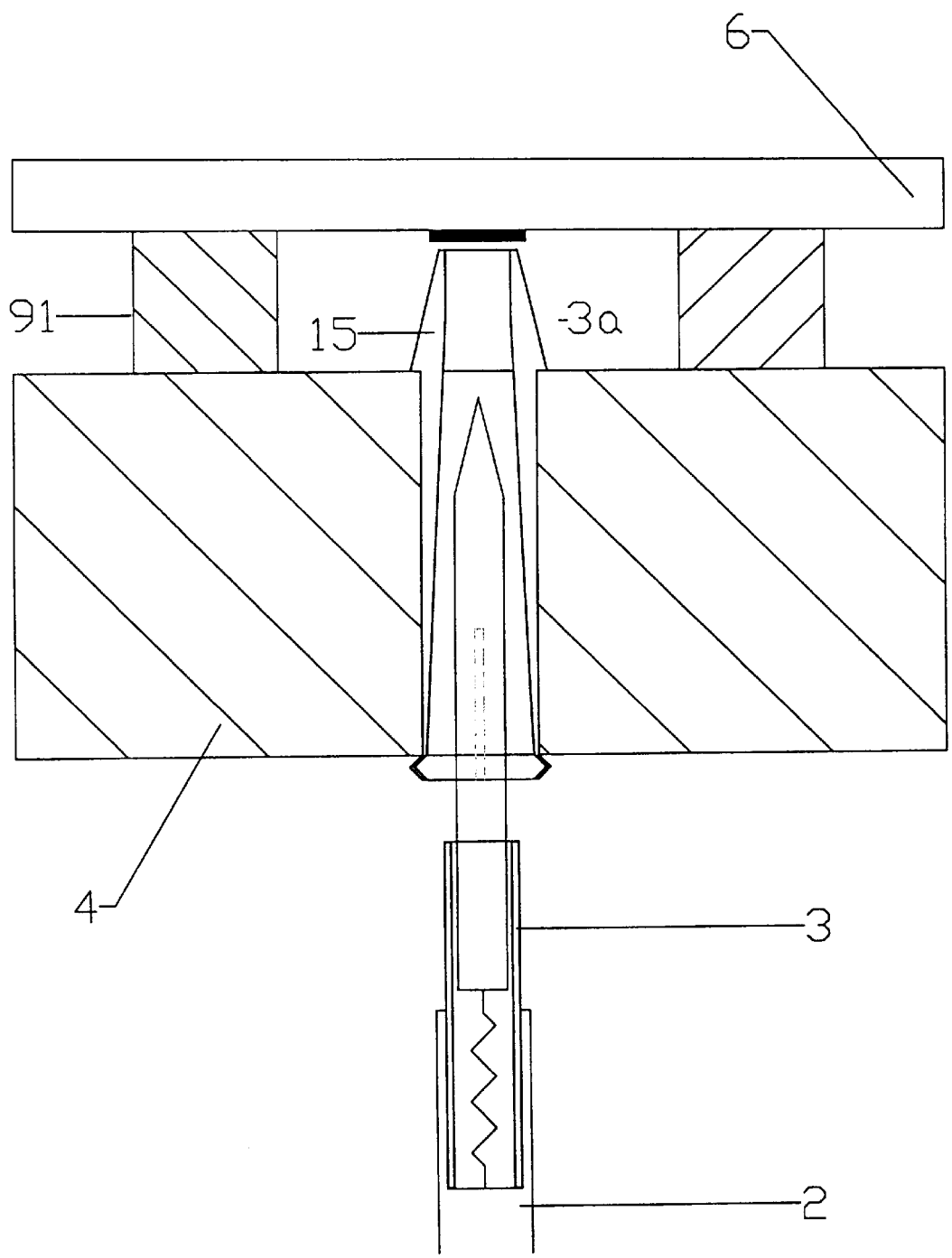
FIG. 11 shows the guiding of the probe with inserted receptacles

Two improved solutions according to the invention are described in FIG. 11 and FIG. 12. In the first variant (FIG. 11) an additional guide receptacle 15 manufactured usefully as turned part 15 is applied, the geometry of which can be optimally adapted to the requirements of the guiding. It is advantageous that an material with gut guide properties (brass in case of steel plungers for instance) can be used for the receptacle, that the range of the distance between moving plate and circuit board is jointly used for the guide, and that the parts are easily replaceable in case of wear, and that it is easier to adapt optimally the geometry of bore in the receptacle to the requirements. The represented receptacle is set down in the moving plate and can be tightly mounted by engagement, for instance, as well as it can be dismantled again by means of a pushing tool.

A further advantage is the easy changeability of the guide diameter immediately during the start of the production. If it would turn out that a chosen very narrowed guiding leads in series production at individual places to sporadic jamming of the spring contact pin, the guide diameter can be easily adapted by exchange of the guiding receptacle. A further alternative of the improved guiding by means of a special guiding plate 95 is represented in FIG. 12. The left representation shows the adapter in case of non-sucked circuit board, the right in sucked state. The guiding plate is mounted on the moving plate 4 usefully by means of locating pins and several screws, and corresponds to the size of circuit board 6 to be contacted. A more reliable immersion of the spring contact pin 3 in case of very narrow guiding is ensured by the two-stage guiding in conjunction with the guiding moving plate. Above all the guiding plate can be replaced easier in case of wear and less distance of the narrowest guiding in vertical direction results nearer to the circuit board 6 to be tested. Eventual conflicts with the components mounted from below can be solved easily by means of an appropriate recess in the guiding plate 95. It is a further advantage that for the guiding plate 95 another material better adapted to the requirements of the guiding can be used than in case of the circuit board supporting plate. Furthermore precise and off-center-free bores at smallest bore diameters are made considerably easier by the little thickness of the separate guiding plate.

A further peculiarity of the offset correction results, if a double-sided contacting is necessary. Here the additional problem occurs that the upper and lower copper pattern can have a different offset in comparison with the hole pattern.

In case of requirements of average accuracy it is sufficient to measure also the offset on the top side by means of additional sensors and to take them into account in the calculation of the correction.

Figure 13:
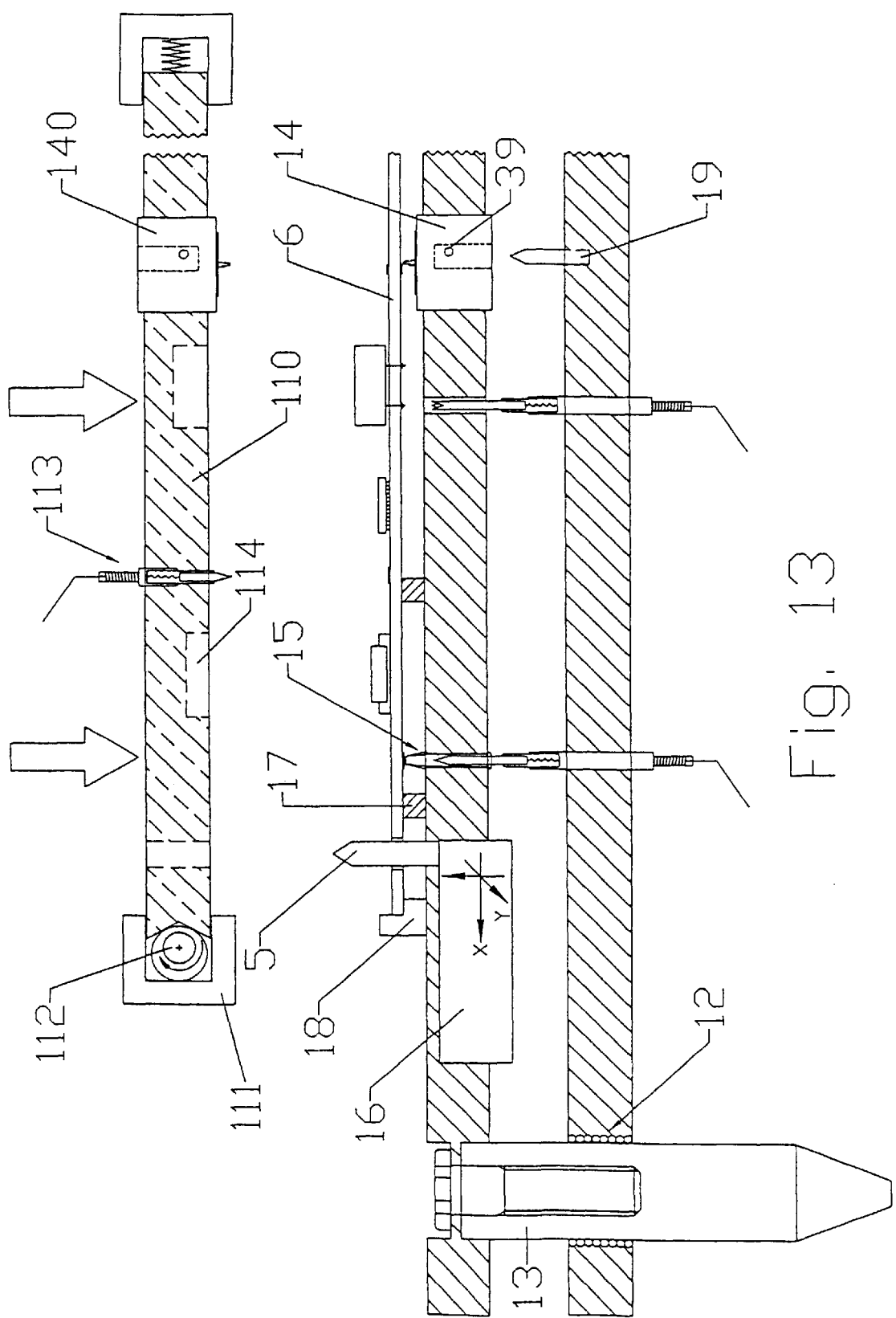
FIG. 13 shows a solution of the correction of the offset in case of double-sided contacting

In case of requirement of high accuracy a separate adjusting unit is necessary on the top side, which is represented in FIG. 13. This has to shift the total upper probe supporting plate 110, what can be effected by the excentric rotation axis 112 represented for a swivel joint in the figure. As already mentioned before, spring contact pins 113 with little spring deflection and therefore less axial wobbling clearance should be used here.

In FIG. 13 the technically known methods of connecting rotatably and linearly lowerably the upper probe plate with the lower adapter as well as a device for the movement of the upper sensor 140 are not drawn in separately.

It is alternatively advisable in particular in case of adapter systems with basic device to use a universally usable top part for the top side unit, where the upper plate is shifted on the whole by means of two locating pins shiftable manually and automatically.

The combination with a probe guiding does not have so great importance, because for the largest number of applications operating from the top side only plane surfaces are contacted. For this then probes with a considerably little spring deflection and therefore clearly less wobbling clearance can be used.

Figure 14:
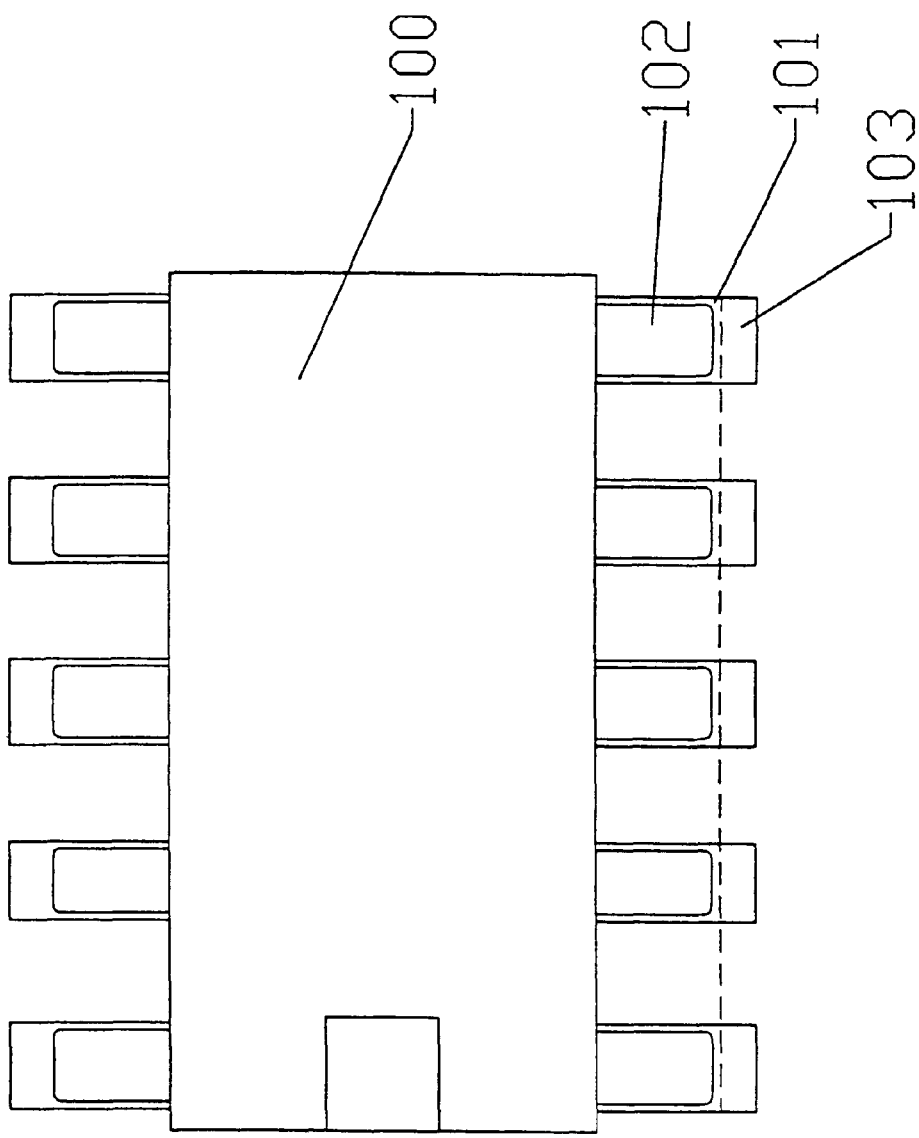
FIG. 14 shows a possible probe contacting on the connection pad of a surface-mounted component

The high positioning accuracy of the contacting achievable totally by the invention gives the user not only the advantage of reduced test pads, but it also allows to use the very economic test method with test adapter for assemblies that up to now were not testable because of missing test pads with a bed-of-nails adapter. FIG. 14 shows as example connection pads 101 of a surface-mounted component 100 with the connecting terminals 102. From many forms of component housing a pad range 103 results, which would be suitable for a contacting with sufficient contacting accuracy.

Furthermore in case of missing test pads circuit line ranges could be left as test pads only by a modification of the solder resist mask. On top of that in case of thin circuit lines good contacting can also be achieved, doing without very pointed and therefore aggressive forms of the probe, by partial gilding. In case of boards with great extension in one direction, for instance, elongated ranges can be selected in this direction, for instance, so that a distortion is tolerated better.

Here it is advisable, in case of test pads not being predetermined by the designer and to be recharged, knowing the exact size of the geometry of the assemblies, of the used copper pads on the circuit board and of the course of the track, to make a software-optimized selection of the best contact locations for the test adaptation. Here the parameters test pad distance (and with it probe size), size of contact range in x and y direction, maximum stretch or shrinkage of the board in X and Y direction referred to the center of the board and to the accuracy of the guiding of the probe have to be matched with each other. The probe positions determined here then enter the data generation for the construction of the test adapter.

It is not in all cases that the full extent of the automatic correction is needed for secure contacting. This is the case in particular, if, as experience shows, the used boards have high accuracy or if the development can still supply relatively large test points. In these cases it is an alternative to provide at first catch pins, which can be adjusted only manually, and to measure the probe offset from the impression of the probe by means of a microscope.

By means of modular constructions the automatic correction could then be set up later on. The embodiment of the adjusting unit improved according to the invention, with adjusting wheels, which can be reproducibly adjusted and are provided with scales, allows also here a course suitable to application, because after the ascertaining of the offset and the conversion of the values to the adjusting unit a specific correction can be accomplished that can be carried out in one run of correction. It is advisable here, too, to provide an adjustment assistance supported by software. Since the correction can be effected without dismantling the adapter and with clear instructions for readjustment the required easy possibility of correction during the production is given.

What is claimed is:

1. Test adapter for testing a loaded circuit board (6), comprising
    a probe plate (1), on which test probes (3) for the contact of plungers of the test probes (3a) with test points (7) of the circuit board (6) are fixed.
    a moving plate (4), with which the circuit board (6) can be coupled by means of locating pins (5), that is arranged between the circuit board (6) and the probe plate (1) and having through bores (8) for the test probes (3), and
    an adjusting device (50–65), by means of which the position of the circuit board (6) is adjustable with regard to the plunger positions of the test probes (3), wherein with a movement of the probe plate (1) towards the circuit board (6), the plungers of the test probes (3) meet the test points on the circuit board (6), and the adjusting device (50–65) affects each locating pin (5) and establishes adjustably the locating pins (5) in the moving plate (4) in a plane parallel to the plane of the circuit board.

2. Test adapter according to claim 1, wherein
    the test adapter comprises a sensor fixture (14) with at least two sensors, which are provided on the moving plate (4) and with which points of reference of the circuit board (6) coupled with the moving plate (4) are measurable.

3. Test adapter according to claim 1, wherein the sensor fixture (14) measures the offset between the moving plate (4) and the circuit board (6) coupled with it without the necessity of special points of reference.

4. Test adapter according to claim 2, wherein the sensor fixture (14) comprises movable point sensors.

5. The test adapter according to claim 2, wherein the sensor fixture (14) comprises movable optical reflex sensors.

6. Test adapter according to claim 2, wherein the movement of the sensor fixture (14) is effected over the movement of the probe plate (1) towards the circuit board (6).

7. Test adapter according to claim 2 wherein the sensor fixture (14) comprises electrically conducting surfaces, which together with tracks of the printed circuit board, represent an offset-proportional electrically measurable element as a capacity or a inductivity.

8. Test adapted according to claim 2, wherein the sensors of the sensor fixture (14) are arranged near the center of the circuit board (6).

9. Test adapter according to claim 2, wherein the points of reference are determined tracks or track edges of the printed circuit board (6).

10. Test adapter according to claim 2, wherein a sensor measures the position of a first circuit board or circuit board edge for the measurement of an xy offset and another sensor measures the position of a second circuit line or circuit line edge, which runs vertically to the first, spatially separated circuit line.

11. Test adapter according to claim 2, wherein one end of each of the two pins is capable of engaging with the receiving holes (20) of the circuit board (6) and the other end of each of the pins is adjustably established in the moving plate (4) by means of an adjusting mechanism (16).

12. Test adapter according to claim 11, wherein one of the locating pins is movable parallel to the plane of the circuit board by means of an adjusting mechanism (16), and the other locating pin is movable in one direction by means of the adjusting mechanism (16) and movable in a second direction by a spring-loaded element.

13. Test adapter according to claim 11, wherein the locating pins (5) are fixed on the circuit board (6), spring-loaded on one side, in order to compensate for the clearance of the locating pins (5) in the receiving holes of the circuit board (6).

14. Test adapter according to claim 1, wherein the movement of the adjusting device (5, 50–65) is effected by means of a motor, and further comprising a motor control which controls the motor, depending upon the signals of the sensors (14), so that the adjusting device (5, 50–65) is adjusted in an automatic control loop.

15. Test adapter according to claim 1, wherein the movement of the adjusting device (5, 50–65) is effected manually by hand wheels provided with scales.

16. Test adapter according to claim 1, wherein guide receptacles are provided in the through bores (8) of the moving plate (4) for the test probes (3).

17. Test adapter according to claim 1, wherein, arranged on that side of the moving plate (4) that faces the circuit board (6), is a guide plate (95), which has guide bores for the test probes (3) at the through bores (8) of the moving plate (4).

18. Test adapter according to claim 2, wherein the evaluation device is coupled with the sensor fixture (14) and the adjusting device (5, 50–65), and the evaluation device compares the positions of determined circuit lines or circuit line edges of the switching arrangement of the circuit board (6), which are detected by the sensor fixture (14), with the corresponding theoretical positions and so determines the offset of the factual circuit line pattern and transfers it to the adjusting device (5, 50–65).

19. Test adapter according to claim 1, wherein the test adapter comprises three sensors for the detection of the offset and the turn of the circuit line pattern to the bore holes.

20. Test adapter, where two test adapters according to claim 1 are arranged on both sides of the circuit board (6) to be tested, each adjusting device making possible an independent adjustment of both test adapters with regard to each switching arrangement on each side of the circuit board

* * * * *